(12) United States Patent
Scatamacchia et al.

(10) Patent No.: US 12,549,135 B2
(45) Date of Patent: Feb. 10, 2026

(54) AMPLIFIER DEVICE WITH MULTI-STAGE AMPLIFIER PACKAGE

(71) Applicant: NXP USA, Inc., Austin, TX (US)

(72) Inventors: Damien Scatamacchia, Toulouse (FR); Cedric Cassan, Muret (FR); Yuanyuan Dong, Plaisance du Touch (FR)

(73) Assignee: NXP USA, Inc., Austin, TX (US)

( * ) Notice: Subject to any disclaimer, the term of this patent is extended or adjusted under 35 U.S.C. 154(b) by 462 days.

(21) Appl. No.: 18/164,433

(22) Filed: Feb. 3, 2023

(65) Prior Publication Data

US 2024/0213927 A1 Jun. 27, 2024

(30) Foreign Application Priority Data

Dec. 21, 2022 (EP) .................................. 22306965

(51) Int. Cl.
*H03F 1/02* (2006.01)
*H01L 23/66* (2006.01)
(Continued)

(52) U.S. Cl.
CPC .......... *H03F 1/0288* (2013.01); *H01L 23/66* (2013.01); *H03F 1/565* (2013.01); *H03F 3/195* (2013.01);
(Continued)

(58) Field of Classification Search
CPC ........ H03F 1/0288; H03F 1/565; H03F 3/195; H03F 3/245; H03F 2200/451; H01L 23/66; H01L 2223/6611; H01L 2223/6655
(Continued)

(56) References Cited

U.S. PATENT DOCUMENTS

| 9,199,004 | B2 | 12/2015 | Wang et al. |
| 10,250,197 | B1 | 4/2019 | Schultz et al. |
| 2023/0198469 | A1* | 6/2023 | Ladhani .................. H03F 3/245 455/114.3 |

OTHER PUBLICATIONS

K. Nakatani et. al., "A Highly Integrated RF Frontend Module including Doherty PA, LNA and Switch for High SHF Wide-band Massive MIMO in 5G" Published in 2017 IEEE Topical Conference on RF/Microwave Power Amplifiers for Radio and Wireless Applications (PAWR). (Year: 2017).*

(Continued)

*Primary Examiner* — Hafizur Rahman
(74) *Attorney, Agent, or Firm* — Andrew C. Milhollin

(57) ABSTRACT

An amplifier device may include at least one two-stage amplifier package, where an amplifier of a first amplification stage of the amplifier package may be aligned opposite to amplifiers of a second amplification stage of the amplifier package. The amplifier device may be a three-stage amplifier device, where the second stage of the two-stage amplifier package is coupled to amplifiers of a final (third) stage, which may be in a Doherty configuration. The amplifiers of the second stage may be arranged in any of a class AB configuration, a Doherty configuration, a multi-stage Doherty configuration (with amplifiers of the final amplification stage), or a multi-driver, multi-stage Doherty configuration. One or more passive components used for interstage impedance matching may be disposed outside of the two-stage amplifier package. Amplifiers of the first, second, and third amplification stages may each be gallium nitride (GaN) amplifiers, in some embodiments.

18 Claims, 8 Drawing Sheets

(51) Int. Cl.
H03F 1/56 (2006.01)
H03F 3/195 (2006.01)
H03F 3/24 (2006.01)

(52) U.S. Cl.
CPC ...... *H03F 3/245* (2013.01); *H01L 2223/6611* (2013.01); *H01L 2223/6655* (2013.01); *H03F 2200/451* (2013.01)

(58) Field of Classification Search
USPC .................................................. 330/124 R
See application file for complete search history.

(56) References Cited

OTHER PUBLICATIONS

Freescale / NXP Document No. MD8IC970N, Rev. 2, May 2011, "RF LDMOS Wideband Integrated Power Amplifiers", May 2011, 17 pages.

Freescale Semiconductor, Technical Data, Document No. AFIC901N—Rev. 0, Jan. 2016 "RF LDMOS Wideband Integrated Power Amplifier", Jan. 2016, 20 pages.

* cited by examiner

AMPLIFIER DEVICE WITH MULTI-STAGE AMPLIFIER PACKAGE

CROSS-REFERENCE TO RELATED APPLICATIONS

This application claims the priority under 35 U.S.C. § 119 of European patent application no. 22306965.9, filed Dec. 21, 2022, the contents of which are incorporated by reference herein.

TECHNICAL FIELD

Embodiments of the subject matter described herein relate generally to power amplifiers, and, more specifically, to multi-stage power amplifier devices.

BACKGROUND

Various wireless transmission systems use power amplifiers for increasing the power of a high frequency signal. In a wireless communication system, a power amplifier is usually the last amplifier in a transmission chain (i.e., the output stage). For wireless infrastructure markets, it is generally desirable for base stations to be as small as possible to decrease their visibilities on the environment. In consequence, transmitter paths are designed to be compact, such that it is advantageous to reduce the footprint of radio frequency (RF) amplifier packages and associated passive components. For some macro applications, it may be desirable for a given transmitter path to have at least 45 dB of gain, which typically requires three stages of amplification and is conventionally implemented using a series of amplifier circuits having a relatively large footprint.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, an amplifier package may include a first amplification stage having a first amplifier aligned in a first direction and a second amplification stage having a second amplifier aligned in a second direction and a third amplifier aligned in the second direction. The second amplifier is disposed in a first amplification path. The third amplifier is disposed in a second amplification path that is separate from the first amplification path. The second direction is opposite the first direction.

In one or more embodiments, an input of the first amplifier is coupled to a first conductive pad at a first side of the amplifier package, an output of the first amplifier is coupled to a second conductive pad at a second side of the amplifier package, an input of the second amplifier is coupled to a third conductive pad at the second side of the amplifier package, and an output of the second amplifier is coupled to a fourth conductive pad at the first side of the amplifier package.

In one or more embodiments, each of the first amplifier, the second amplifier, and the third amplifier respectively include at least one gallium nitride transistor device.

In one or more embodiments, the amplifier package includes a reference plane on which each of the first amplifier, the second amplifier, and the third amplifier are disposed.

In one or more embodiments, the amplifier package includes a first wire fence disposed on the reference plane between the first amplification path and the second amplification path, and a second wire fence disposed on the reference plane between the first amplification stage and the second amplification stage.

In an example embodiment, an amplifier system includes a first amplifier package that includes a first amplification stage having a pre-driver amplifier aligned in a first direction and a second amplification stage having a first driver amplifier aligned in a second direction and a second driver amplifier aligned in the second direction. The first driver amplifier is disposed in a first amplification path. The second driver amplifier is disposed in a second amplification path that is separate from the first amplification path. The second direction is opposite the first direction. The amplifier system includes a first coupler having a first port coupled to an output of the pre-driver amplifier, a second port coupled to an input of the first driver amplifier, and a third port coupled to an input of the second driver amplifier.

In one or more embodiments, the amplifier system includes a third amplification stage coupled to the second amplification stage. The third amplification stage includes a carrier amplifier, a peaking amplifier, and a first combining node coupled to an output of the carrier amplifier and an output of the peaking amplifier.

In one or more embodiments, the amplifier system includes a second coupler having inputs respectively coupled to an output of the first driver amplifier and an output of the second driver amplifier, and a third coupler having an input coupled to an output of the second coupler and having outputs respectively coupled to an input of the carrier amplifier and an input of the peaking amplifier.

In one or more embodiments, the amplifier system includes a second combining node coupled to an output of the first driver amplifier and an output of the second driver amplifier, a second coupler having outputs respectively coupled to an input of the carrier amplifier and an input of the peaking amplifier, and a circulator coupled between the second combining node and an input of the second coupler.

In one or more embodiments, the amplifier system includes a first circulator coupled between an output of the first driver amplifier and an input of the carrier amplifier, and a second circulator coupled between an output of the second driver amplifier and an input of the peaking amplifier.

In one or more embodiments, the amplifier system includes a second amplifier package having a fourth amplification stage and a fifth amplification stage, and includes a second coupler. The fourth amplification stage includes a second pre-driver amplifier aligned in the first direction. The fifth amplification stage includes a third driver amplifier aligned in the second direction and a fourth driver amplifier aligned in the second direction. The third driver amplifier is disposed in a third amplification path. The fourth driver amplifier is disposed in a fourth amplification path that is separate from the third amplification path. The second coupler includes a fourth port coupled to an output of the second pre-driver amplifier, a fifth port coupled to an input of the third driver amplifier, and a sixth port coupled to an input of the fourth driver amplifier.

In one or more embodiments, the amplifier system includes a third coupler having inputs respectively coupled to an output of the first driver amplifier and an output of the second driver amplifier and having an output coupled to an input of the carrier amplifier, a fourth coupler having inputs respectively coupled to an output of the third driver amplifier and an output of the fourth driver amplifier and having an output coupled to an input of the peaking amplifier, and a fifth coupler having an input coupled to an input of the amplifier system and having outputs respectively coupled to an input of the pre-driver amplifier and an input of the second pre-driver amplifier.

In one or more embodiments, the amplifier system includes an attenuator coupled between the fifth coupler and the input of the pre-driver amplifier.

In one or more embodiments, the first driver amplifier and the second driver amplifier are in a class AB amplifier configuration.

In one or more embodiments, the first driver amplifier and the second driver amplifier are in a Doherty amplifier configuration.

In one or more embodiments, each of the pre-driver amplifier, the first driver amplifier, and the second driver amplifier respectively include gallium nitride transistor devices.

In one or more embodiments, an input of the pre-driver amplifier is coupled to a first conductive pad at a first side of the first amplifier package, an output of the pre-driver amplifier is coupled to a second conductive pad at a second side of the first amplifier package, an input of the first driver amplifier is coupled to a third conductive pad at the second side of the first amplifier package, and an output of the first driver amplifier is coupled to a fourth conductive pad at the first side of the first amplifier package. The first side is opposite the second side.

In one or more embodiments, an input of the pre-driver amplifier is coupled to a first conductive pad at a first side of the first amplifier package, an output of the pre-driver amplifier is coupled to a second conductive pad at a second side of the first amplifier package, an input of the first driver amplifier is coupled to a third conductive pad at the second side of the first amplifier package, and an output of the first driver amplifier is coupled to a fourth conductive pad at a third side of the first amplifier package. The third side is opposite the second side.

In one or more embodiments, the first amplifier package includes a reference plane on which each of the pre-driver amplifier, the first driver amplifier, and the second driver amplifier are disposed.

In one or more embodiments, the first amplifier package includes a first wire fence disposed on the reference plane between the first amplification path and the second amplification path and a second wire fence disposed on the reference plane between the first amplification stage and the second amplification stage.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

DETAILED DESCRIPTION

Figure 1:
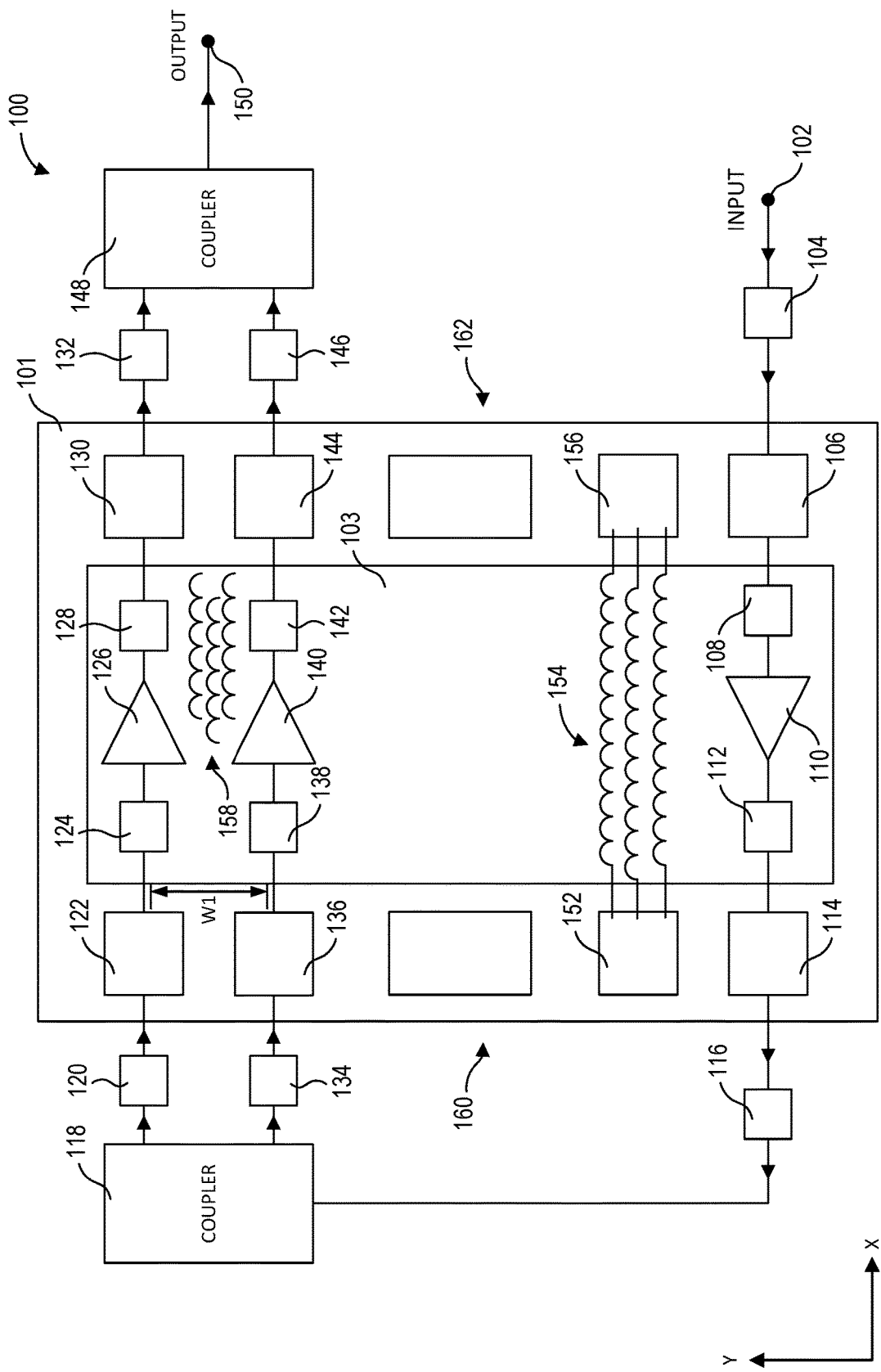
FIG. 1 is a block diagram of an example amplifier device that includes a two-stage amplifier package, where an amplifier of the first stage of the amplifier package is aligned opposite the amplifiers of the second stage of the amplifier package, according to an embodiment.

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. As used herein, the words "exemplary" and "example" mean "serving as an example, instance, or illustration." Any implementation described herein as exemplary or an example is not necessarily to be construed as preferred or advantageous over other implementations.

Directional references such as "top," "bottom," "left," "right," "above," "below," and so forth, unless otherwise stated, are not intended to require any preferred orientation and are made with reference to the orientation of the corresponding figure or figures for purposes of illustration.

For the sake of brevity, conventional semiconductor fabrication techniques may not be described in detail herein. In addition, certain terms may also be used herein for reference only, and thus are not intended to be limiting. For instance, the terms "first", "second", and other such numerical terms referring to structures do not imply a sequence or order unless clearly indicated by the context.

Power amplifiers, such as those incorporated into wireless transmission systems, include one or more amplifier transistors configured to amplify the power of a high frequency signal to a level suitable for transmission. For most macro wireless infrastructure applications, a given amplification system requires three stages of amplification to achieve a desired level of gain (e.g., typically a gain of around 45 dB) for the transmitter (TX) path. The three stages of amplification may include two driver stages and a final stage. Conventional three-stage amplifier systems for such applications typically use separate packages for each driver stage, use lower-performance laterally-diffused metal-oxide semiconductor (LDMOS) amplifiers, require different power supplies for each stage, use fixed architectures (i.e., fixed amplifier classes), and/or are usable with high (e.g., >1 GHz) frequency bands. Such aspects of conventional three-stage amplifiers systems may undesirably increase the system footprint, reduce design flexibility, and/or limit the applications for which such systems are suitable.

In accordance with various embodiments described herein, an example amplifier device may include a multi-stage (e.g., two-stage) amplifier package. For example, the amplifier package may include a first amplification stage aligned in a first direction and a second output stage aligned in a second direction that is opposite the first direction. By including two amplification stages in a single package and by arranging the first and second amplification stages to be aligned opposite one another, the footprint of the amplifier package (and, therefore, that of the corresponding amplifier device) may be advantageously reduced. The amplifiers of the amplifier package may be gallium nitride (GaN) radio frequency (RF) power amplifiers. At least a portion of the input-impedance matching circuitry and output-impedance matching circuitry for each of the first amplification stage and the second amplification stage may be implemented out-of-package (e.g., on a PCB on which the amplifier package is mounted), which may improve design flexibility of systems that include the multi-stage amplifier package by allowing customization of the amplifier class of each amplification stage thereof. For example, the second amplification stage of the multi-stage amplifier package may be arranged in a class-AB configuration, a Doherty configuration, or a multi-stage Doherty configuration. Such improved design flexibility may improve the range of operating frequencies for which the amplifier device is suitable for use (e.g., a range of less than 1.0 GHz to around 3.5 GHZ).

In one or more embodiments, the first amplification stage and the second amplification stage may each include amplifiers implemented using the same technology (e.g., III-V semiconductor based amplifiers, such as GaN amplifiers), such that each of the amplifiers in the multi-stage amplifier package operate using the same power supply voltage (e.g., 48 V), which may also be the same as the power supply voltage supplied to amplifiers of at least one other stage (e.g., the "final stage") of the amplifier device that includes the multi-stage amplifier package.

FIG. 1 shows a circuit diagram of an example amplifier system 100 that includes a two-stage amplifier package 101. The amplifier system 100 may correspond to two stages of a larger three-stage amplifier system (e.g., the amplifier systems 400, 500, 600, 700 of FIGS. 4, 5, 6, and 7, respectively), and may act as either the first two stages or the last two stages of the three-stage amplifier system in accordance with various embodiments. The amplifier system 100 may include the amplifier package 101, an input 102, out-of-package input impedance matching circuitry 104, in-package input impedance matching circuitry 108, a pre-driver amplifier 110 (e.g., corresponding to a first amplification stage), in-package output impedance matching circuitry 112, out-of-package input impedance matching circuitry 116, a first coupler 118, a second coupler 148, out-of-package input impedance matching circuitry 120, out-of-package input impedance matching circuitry 134, in-package input impedance matching circuitry 124, in-package input impedance matching circuitry 138, a first driver amplifier 126 (e.g., corresponding to a first amplifier of a second amplification stage), a second driver amplifier 140 (e.g., corresponding to a second amplifier of the second amplification stage), in-package output impedance matching circuitry 128, in-package output impedance matching circuitry 142, out-of-package output impedance matching circuitry 132, out-of-package output impedance matching circuitry 146, wire fences 154, 158, and an output 150.

The amplifier package 101 may include a conductive reference plane 103 (sometimes referred to as a ground plane 103) and conductive pads 106, 114, 122, 130, 136, 144, 152, 156. Herein, the terms "ground," "reference plan," "reference potential," and "ground potential" may be understood to refer to a node or plane that is at a ground voltage or reference voltage. The amplifier package 101 may be disposed on (e.g., adhered or otherwise attached to) a substrate (e.g., a printed circuit board (PCB) substrate; not shown) of the amplifier system 100. The amplifier package 101 may house or otherwise include the in-package input impedance matching circuitries 108, 124, 138, the in-package output impedance matching circuitries 112, 128, 142, the pre-driver amplifier 110, the first driver amplifier 126, the second driver amplifier 140, the wire fence 154, and the wire fence 158. In one or more embodiments, the amplifier package 101 may be a dual flat no-leads (DFN) package, although it should be understood that this example is intended to be illustrative and not limiting. For example, dual in-line packages (DIPs), small outline integrated circuits (SOICs), quad flat no-lead (QFN) packages, or other suitable package types may instead be used to implement the amplifier package 101 in one or more other embodiments.

The input 102 may be configured to receive RF signals to be amplified by the amplifier system 100. In one or more embodiments, the input 102 may be coupled to an RF signal source (not shown) configured to provide such RF signals. The input 102 may be coupled to the input of the pre-driver amplifier 110 via the conductive pad 106. Herein, the "input" of a given amplifier, such as the pre-driver amplifier 110, the first driver amplifier 126, and the second driver amplifier 140, should be understood to refer to one or more gate terminals or control terminals of one or more transistors of that amplifier, unless noted otherwise. The output of the pre-driver amplifier 110 may be coupled to an input (i.e., "first port") of the coupler 118. Herein, the "output" of a given amplifier, such as the pre-driver amplifier 110, the first driver amplifier 126, and the second driver amplifier 140, should be understood to refer to one or more drain terminals or current-carrying terminals of one or more transistors of that amplifier, unless noted otherwise.

The coupler 118 may further include a first output (i.e., "second port") and a second output (i.e., "third port"), where the first output is coupled to an input of the first driver amplifier 126 via the conductive pad 122, and the second output is coupled to an input of the second driver amplifier 140 via the conductive pad 136. The output of the first driver amplifier 126 may be coupled to a first input (i.e., "first port") of the coupler 148 via the conductive pad 130. The output of the second driver amplifier 140 may be coupled to a second input (i.e., "second port") of the coupler 148 via the conductive pad 144. The output (i.e., "third port") of the coupler 148 may be coupled to the output 150 of the amplifier system 100. For embodiments in which the coupler 148 is a combining node, it should be understood that the first input, the second input, and the output of the coupler 148 all correspond, respectively, to inputs to and an output from a single node.

In one or more embodiments, the coupler 118 may be a 3 dB coupler, such as a symmetrical 3 dB coupler. In one or more embodiments, the coupler 118 may include a fourth port that is coupled to ground via a resistor (e.g., a 50Ω resistive load). In one or more embodiments, the coupler 148 may be a 3 dB coupler, such as a symmetrical 3 dB coupler. In one or more other embodiments, either or both of the coupler 118 and the coupler 148 may be another applicable type of power splitter, power divider, or directional coupler. The coupler 118 may be configured to divide RF signals received at the input of the coupler 118 between a first amplification path that includes the first driver amplifier 126 and a second amplification path that includes the second driver amplifier 140. This may correspond to a division of the power of the incoming RF signals, where, in a symmetrical configuration, the coupler 118 divides the power of the incoming RF signals evenly between its first and second outputs, and, in an asymmetrical configuration, the coupler 118 divides the power of the incoming RF signals unevenly between its first and second outputs.

Figure 5:
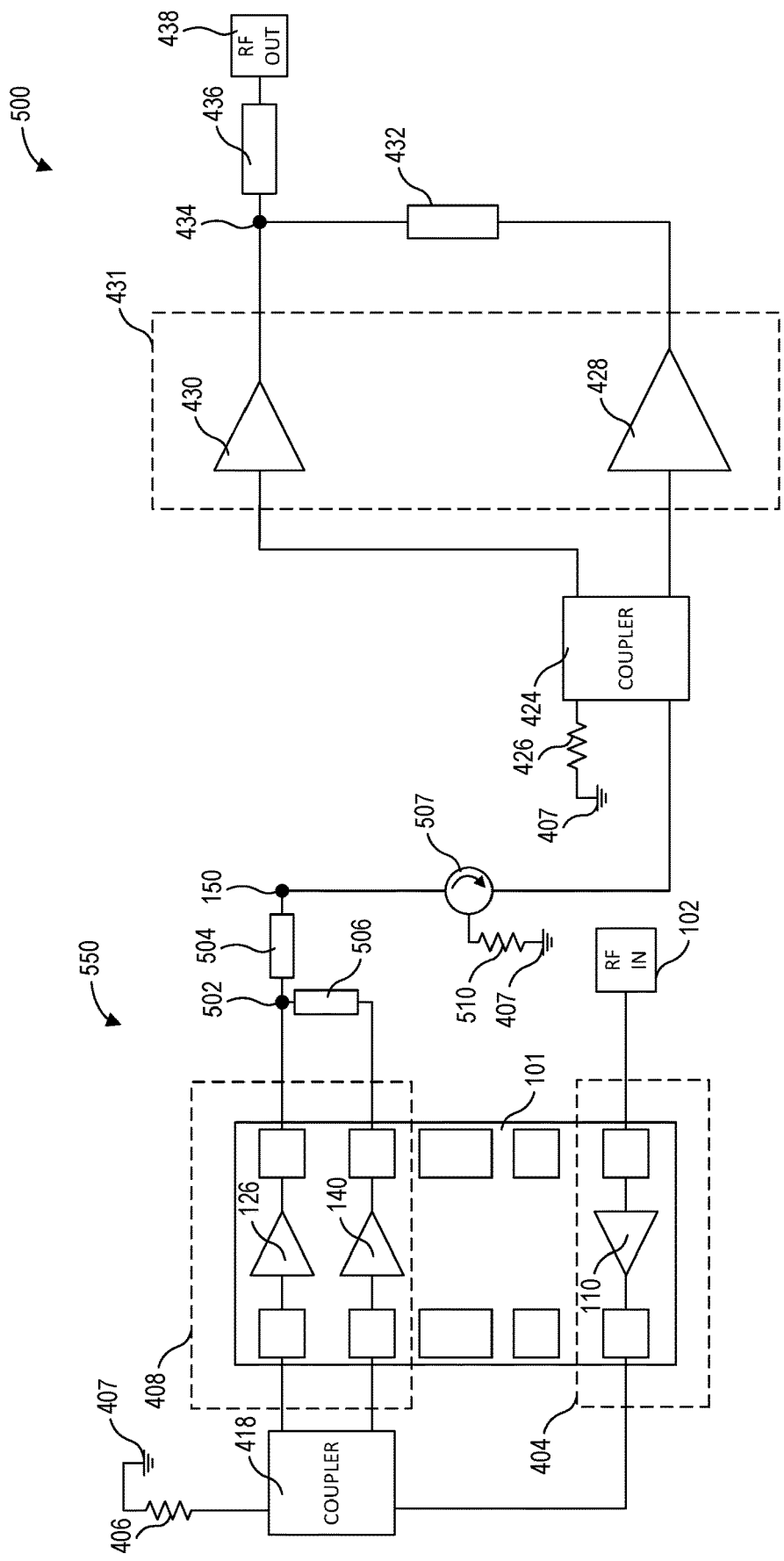
FIG. 5 shows a block diagram of an example three-stage amplifier that includes a two-stage amplifier package, which may correspond to either of the amplifier packages of FIGS. 1 and 2, with a second stage that may be in a Doherty configuration, coupled to a final amplification stage, according to an embodiment.

In one or more other embodiments, the coupler 148 may instead be a combining node coupled to each of the conductive pads 130, 144 and the output 150 (e.g., as shown in the amplifier system 500 of FIG. 5). In one or more other embodiments, the coupler 148 may be omitted, and the amplification path that includes the first driver amplifier 126 may be coupled to a first amplification path of a final amplification stage via a first circulator and the amplification path that includes the second driver amplifier 140 may be coupled to a second amplification path of the final amplification stage via a second circulator (e.g., as shown in the example of the amplifier system 600 of FIG. 6).

In one or more embodiments, the output 150 may be coupled to a load (e.g., an antenna for one or more embodiments in which the amplifier system 100 may be included in an RF transmitter device). In one or more other embodiments, the output 150 may be coupled to a final amplification stage.

The out-of-package input impedance matching circuitry 104 may be coupled between the input 102 and the conductive pad 106. The in-package input impedance matching circuitry 108 may be coupled between the conductive pad 106 and the input of the pre-driver amplifier 110. The in-package output impedance matching circuitry 112 may be coupled between the output of the pre-driver amplifier 110 and the conductive pad 114. The out-of-package output impedance matching circuitry 116 may be coupled between the conductive pad 114 and the input of the coupler 118. The out-of-package input impedance matching circuitry 120 may be coupled between the first output of the coupler 118 and the conductive pad 122. The out-of-package input impedance matching circuitry 134 may be coupled between the second output of the coupler 118 and the conductive pad 136. The in-package input impedance matching circuitry 124 may be coupled between the conductive pad 122 and the input of the first driver amplifier 126. The in-package input impedance matching circuitry 138 may be coupled between the conductive pad 136 and the input of the second driver amplifier 140. The in-package output impedance matching circuitry 128 may be coupled between the output of the first driver amplifier 126 and the conductive pad 130. The in-package output impedance matching circuitry 142 may be coupled between the output of the second driver amplifier 140 and the conductive pad 144. The out-of-package output impedance matching circuitry 132 may be coupled between the conductive pad 130 and the first input of the coupler 148. The out-of-package output impedance matching circuitry 146 may be coupled between the conductive pad 144 and the second input of the coupler 148.

In one or more embodiments, one or more of the in-package input impedance matching circuitries 108, 124, 138 or the in-package output impedance matching circuitries 112, 128, 142 may be completely or partially omitted, such that corresponding impedance matching functions are performed fully or partially out-of-package. Providing some or all of the impedance matching circuitries for the first and second amplification stages outside of the amplifier package 101 in this way, may advantageously improve design flexibility of the amplifier system 100, such that second amplification stage (i.e., including the first driver amplifier 126 and the second driver amplifier 140) may be implemented in accordance with various architectures, such as a class-AB amplifier architecture, a Doherty amplifier architecture, or a multi-stage Doherty amplifier architecture (e.g., as described further below in connection with FIGS. 4-7). Such improved design flexibility may improve the range of operating frequencies for which the amplifier package 101 is suitable for use (e.g., a range of less than 1.0 GHz to around 3.5 GHZ).

Herein, "impedance matching circuitry", such as any of the out-of-package input impedance matching circuitries 104, 120, 134, the out-of-package output impedance matching circuitries 116, 132, 146, the in-package input impedance matching circuitries 108, 124, 138 or the in-package output impedance matching circuitries 112, 128, 142, refers to a passive component or network of passive components (e.g., capacitors, inductors, and/or resistors) configured to mitigate impedance mismatching that may occur between two elements. For example, the out-of-package input impedance matching circuitry 104 and the in-package input impedance matching circuitry 108 may be collectively configured to improve impedance matching between the input of the pre-driver amplifier 110 and an RF signal source coupled to the input 102. The in-package output impedance matching circuitry 112 and the out-of-package output impedance matching circuitry 116 may be collectively configured to improve impedance matching between the output of the pre-driver amplifier 110 and the input of the coupler 118. The out-of-package input impedance matching circuitry 120 and the in-package input impedance matching circuitry 124 may be collectively configured to improve impedance matching between the first output of the coupler 118 and the first driver amplifier 126. The out-of-package input impedance matching circuitry 134 and the in-package input impedance matching circuitry 138 may be collectively configured to improve impedance matching between the second output of the coupler 118 and the second driver amplifier 140. The in-package output impedance matching circuitry 128 and the out-of-package output impedance matching circuitry 132 may be collectively configured to improve impedance matching between the first driver amplifier 126 and the first input of the coupler 148 and/or a load coupled to the output 150. The in-package output impedance matching circuitry 142 and the out-of-package output impedance matching circuitry 146 may be collectively configured to improve impedance matching between the second driver amplifier 140 and the second input of the coupler 148 and/or the load coupled to the output 150.

In one or more embodiments, inductors, capacitors, and resistors of any of the out-of-package input impedance matching circuitries 104, 120, 134 or the out-of-package output impedance matching circuitries 116, 132, 146 may be implemented via discrete passive components (e.g., surface mount devices (SMDs)), impedance transformers (e.g., transmission lines), or any applicable combination of these. In one or more embodiments, one or more of the in-package input impedance matching circuitries 108, 124, 138 or the in-package output impedance matching circuitries 112, 128, 142 may be implemented via capacitors, inductors, or resistors formed on integrated passive device die (IPD die). Such IPD die may include dielectric substrates or semiconductor substrates (e.g., silicon substrates) on/in which corresponding passive components (e.g., resistors, capacitors, or inductors) are formed. In one or more embodiments, one or more inductors of the in-package input impedance matching circuitries 108, 124, 138 or the in-package output impedance matching circuitries 112, 128, 142 may be implemented via wire bonds. In one or more embodiments, any of the in-package input impedance matching circuitries 108, 124, 138 or the in-package output impedance matching circuitries 112, 128, 142 may be omitted (e.g., with corresponding components or functions being instead implemented at any of the out-of-package input impedance matching circuitries 104, 120, 134 or the out-of-package output impedance matching circuitries 116, 132, 146, as applicable.

The pre-driver amplifier 110, the first driver amplifier 126, and the second driver amplifier 140 may each, respectively, include a transistor device that includes an array of transistors arranged in parallel. For example, transistor devices of each of the pre-driver amplifier 110, the first driver amplifier 126, and the second driver amplifier 140 may be formed on a respectively separate semiconductor die (e.g., GaN die). That is, each of the pre-driver amplifier 110, the first driver amplifier 126, and the second driver amplifier 140 may respectively include GaN transistor devices. Each of the parallel transistors of the transistor device of the pre-driver amplifier 110 may include a control terminal (e.g., a gate terminal) coupled to the conductive pad 106, a first current-carrying terminal (e.g., a source terminal) coupled to the reference plane 103 (e.g., by one or more through silicon vias (TSVs) formed in the semiconductor die that includes the pre-driver amplifier 110), and a second current-carrying terminal (e.g., a drain terminal) coupled to the conductive pad 114. Each of the parallel transistors of the transistor device of the first driver amplifier 126 may include a control terminal (e.g., a gate terminal) coupled to the conductive pad 122, a first current-carrying terminal (e.g., a source terminal) coupled to the reference plane 103 (e.g., by one or more through silicon vias (TSVs) formed in the semiconductor die that includes the first driver amplifier 126), and a second current-carrying terminal (e.g., a drain terminal) coupled to the conductive pad 130. Each of the parallel transistors of the transistor device of the second driver amplifier 140 may include a control terminal (e.g., a gate terminal) coupled to the conductive pad 136, a first current-carrying terminal (e.g., a source terminal) coupled to the reference plane 103 (e.g., by one or more through silicon vias (TSVs) formed in the semiconductor die that includes the second driver amplifier 140), and a second current-carrying terminal (e.g., a drain terminal) coupled to the conductive pad 144.

In one or more embodiments, the transistors of any or each of the pre-driver amplifier 110, the first driver amplifier 126, and the second driver amplifier 140 may be field effect transistors (FETs). In one or more other embodiments, such transistors may be bipolar junction transistors (BJTs), metal-semiconductor FETs (MESFETs), heterojunction bipolar transistors (HBTs), or high electron mobility transistors (HEMTs). According to various embodiments, the transistors of any or each of the pre-driver amplifier 110, the first driver amplifier 126, and the second driver amplifier 140 may include a III-V material such as GaAs (e.g., as with a GaAs MESFET), InGaP (e.g., as with an InGaP HBT), or GaN (e.g., as with a GaN HEMT or GaN bipolar transistor).

One or more drain bias voltage supplies (not shown) may be coupled to the outputs (i.e., drain terminals) of each of the pre-driver amplifier 110, the first driver amplifier 126, and the second driver amplifier 140 to provide a direct current (DC) drain bias voltage to each amplifier output. For example, the drain bias voltage supplied by such a drain bias voltage supply may be between around 40 V and around 50 V (e.g., around 48 V for GaN-based amplifiers) or between around 20 V and around 30 V (e.g., around 28 V for LDMOS amplifiers) to each of the outputs of the pre-driver amplifier 110, the first driver amplifier 126, and the second driver amplifier 140. In one or more embodiments, the pre-driver amplifier 110, the first driver amplifier 126, and the second driver amplifier 140 are each implemented using GaN transistors and may be coupled to the same drain bias voltage supply to each receive the same drain bias voltage at their respective outputs. That is, implementing each of the pre-driver amplifier 110, the first driver amplifier 126, and the second driver amplifier 140 using the same semiconductor technology (e.g., GaN) may allow each of the pre-driver amplifier 110, the first driver amplifier 126, and the second driver amplifier 140 to receive the same drain bias voltage from the same drain bias voltage supply, which may advantageously reduce the footprint of the amplifier system 100 and, accordingly, any systems or devices that include the amplifier system 100. Similarly, one or more gate bias voltage supplies (not shown) may be coupled to inputs (i.e., gate terminals or control terminals) of the pre-driver amplifier 110, the first driver amplifier 126, and the second driver amplifier 140.

The wire fences 154, 158 may each include one or more rows, with each row including multiple loops of wire bonds. Each of the wire bond loops may extend outward, substantially normal to the plane of the reference plane 103, such that each row of wire bond loops effectively forms a "fence". Each wire bond loop may be formed from conductive material such as copper, aluminum, or gold as non-limiting examples. In one or more embodiments, the wire bond loops of the wire fences 154, 158 may be bonded at both ends directly to the reference plane 103. In one or more other embodiments, the wire bond loops of either or both of the wire fences 154, 158 may be bonded at both ends to respective IPD die disposed on the reference plane 103. The wire fence 154 may be coupled to each of the conductive pad 152 and the conductive pad 156. The wire fence 158 may be disposed between a first amplification path that includes the first driver amplifier 126 and a second amplification path that includes the second driver amplifier 140. The wire fence 154 may be positioned and dimensioned to improve isolation between RF signals at the pre-driver amplifier 110 and RF signals at the first driver amplifier 126 and the second driver amplifier 140 (i.e., between the first amplification stage and the second amplification stage of the amplifier system 100). The wire fence 158 may be positioned and dimensioned to improve isolation between RF signals at the first driver amplifier 126 and RF signals at the second driver amplifier 140 (e.g., particularly at outputs of these amplifiers). In one or more embodiments, the rows of wire bond loops of either or both of the wire fences 154, 158 may be connected to one or more conductive pads of the amplifier package 201. In one or more embodiments, the conductive pads of the amplifier package 201 to which the wire fences 154, 158 are connected may be connected to an external ground.

As shown, the pre-driver amplifier 110 (corresponding to the first amplification stage) is disposed in a first orientation, such that the output of the pre-driver amplifier 110 is directed toward the negative x dimension (with reference to the x-y coordinate plane shown)—that is, toward a first side 160 of the amplifier package 101. The first driver amplifier 126 and the second driver amplifier 140 (together corresponding to the second amplification stage) are each disposed in a second orientation, such that the outputs of the first driver amplifier 126 and the second driver amplifier 140 are directed toward the positive x dimension—that is, toward a second side 162 of the amplifier package 101. By providing the first amplification stage with an alignment that is opposite that of the second amplification stage, the layout of systems (e.g., circuit board layouts) that include the amplifier package 101 may be advantageously simplified.

While, as indicated above, the amplifier 110 may correspond to a pre-driver of a first amplification stage and the amplifiers 126, 140 may correspond to first and second drivers of a second amplification stage in one or more embodiments, such an arrangement is intended to be illustrative and not limiting. For example, in one or more other embodiments, the input 102 may be coupled to an additional amplification stage in which case one or more amplifiers of the additional amplification stage may act as a pre-driver, the amplifier 110 may act as a driver of a second amplification stage, and the amplifiers 126, 140 act as the third (final) amplification stage.

Figure 2:
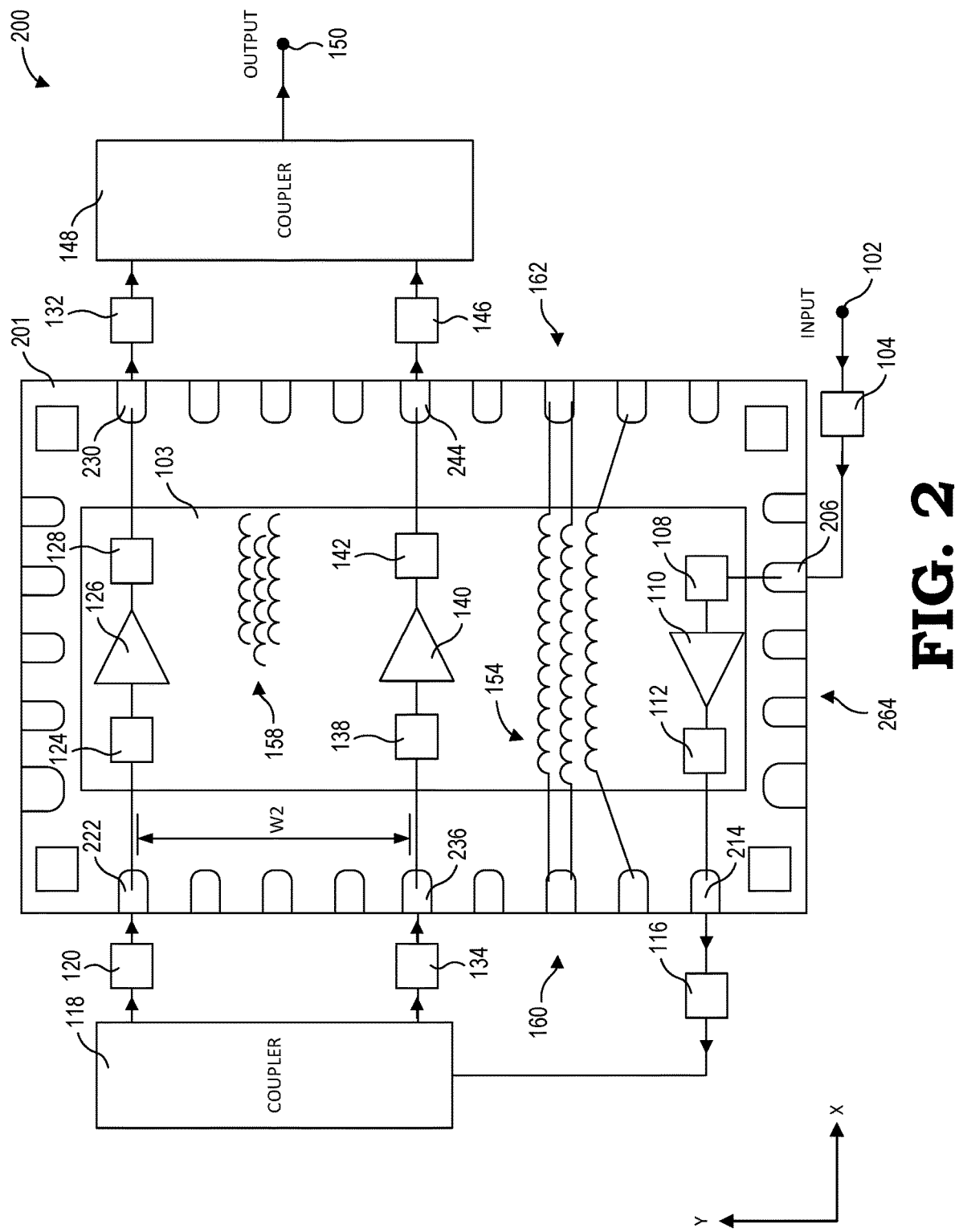
FIG. 2 is a block diagram of an example amplifier system that includes a two-stage amplifier package, where an amplifier of the first stage of the amplifier package is aligned opposite the amplifiers of the second stage of the amplifier package, where an input path through which signals enter the amplifier package is rotated by around 90 degrees relative to output paths through which amplified signals exit the amplifier package, and where distance between the first stage of the amplifier and the second stage of the amplifier is increased relative to that shown in the example of FIG. 1, according to an embodiment.

FIG. 2 shows a circuit diagram of an example amplifier system 200 that includes a two-stage amplifier package 201. Various aspects of the amplifier system 200 may be similar to those of the amplifier system 100 of FIG. 1, and, accordingly, like reference numerals are used to refer to like elements. Descriptions of such elements that have already been provided above are not necessarily repeated here for sake of brevity. In contrast to the amplifier package 101 of FIG. 1, the amplifier package 201 may be a QFN package with conductive pads (i.e., conductive pads 206, 214, 222, 230, 236, 244) disposed at all sides of the amplifier package 201. This may allow for more flexibility in designing the layout of the amplifier system 200, such as allowing the input 102 to be coupled to the input of the pre-driver amplifier 110 via a conductive pad 206 at a third side 264 of the amplifier package 201 that is immediately adjacent to and aligned perpendicular to each of the first side 160 and the second side 162. That is, the angle at which the input 102 is coupled into the amplifier package 201 via the conductive pad 206 corresponds to a 90-degree rotation from the angle at which the output of the pre-driver amplifier 110 is coupled out of the amplifier package 201 via the conductive pad 214. The wire fences 154, 158 may each include rows of multiple wire bond loops disposed on the reference plane 103. In one or more embodiments, the rows of wire bond loops of either or both of the wire fences 154, 158 may be connected to one or more conductive pads of the amplifier package 201. In one or more embodiments, the conductive pads of the amplifier package 201 to which the wire fences 154, 158 are connected may be connected to an external ground.

In the amplifier package 201, the pre-driver amplifier 110 may be coupled between the conductive pad 206 and 214. The first driver amplifier 126 may be coupled between the conductive pad 222 and the conductive pad 230. The second driver amplifier 140 may be coupled between the conductive pad 236 and the conductive pad 244. Compared to the amplifier package 101 of FIG. 1, the amplifier package 201 may have increased separation between the first amplification path that includes the first driver amplifier 126 and the second amplification path that includes the second driver amplifier 140. For example, the first and second amplification paths in the amplifier package 101 of FIG. 1 may be separated by a width W1, the first and second amplification paths in the amplifier package 201 may be separated by a width W2, and the width W2 may be greater than the width W1. Increasing the distance between the first and second amplification paths of the second amplification stage in this way may improve isolation between the first and second amplification paths advantageously. It should be noted that a tradeoff for this increased separation between the first and second amplification paths may be that the amplifier package 201 is comparatively larger than the amplifier package 101 of FIG. 1.

Figure 3:
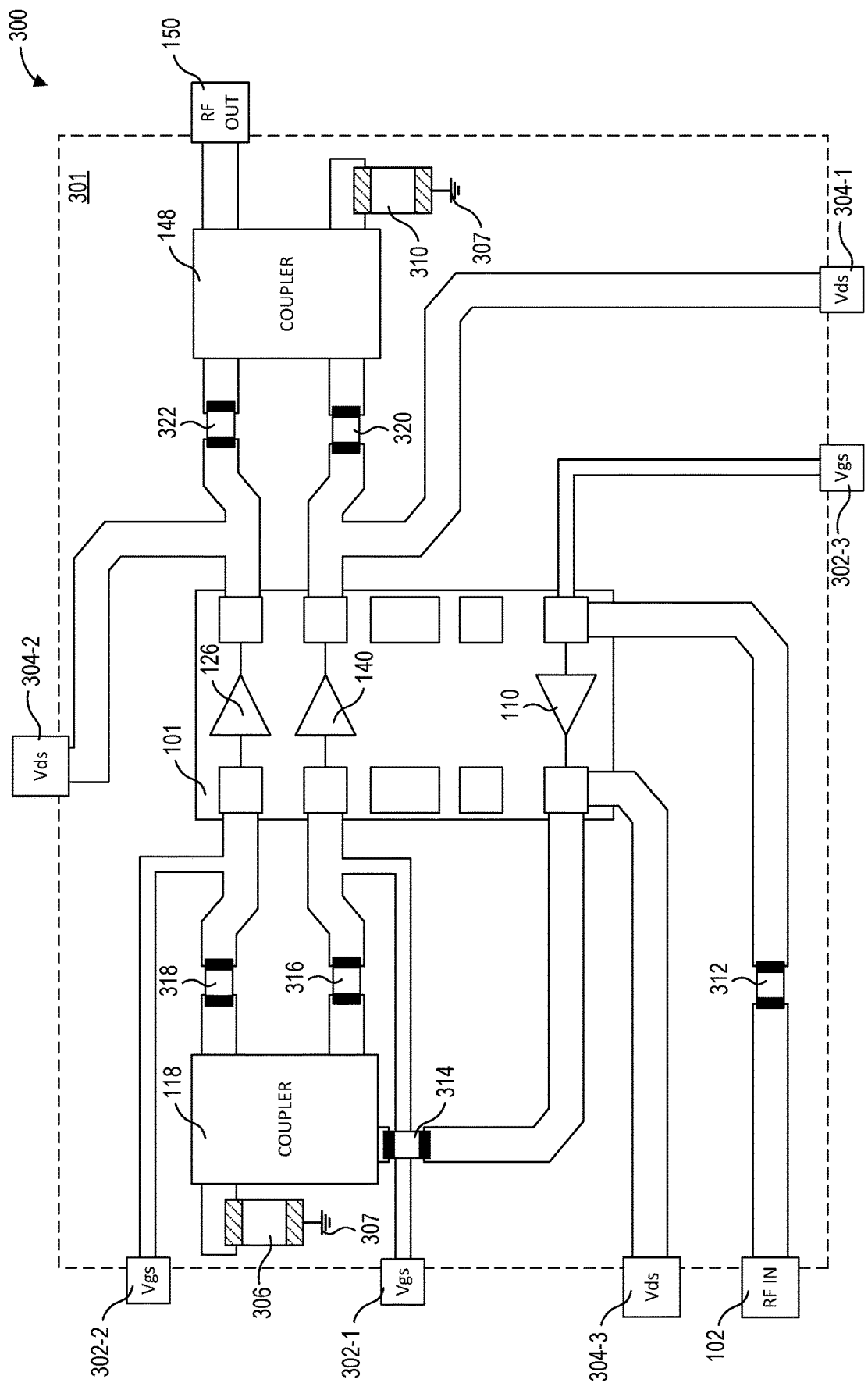
FIG. 3 shows a top-down view of an example amplifier system that includes a two-stage amplifier package, which may correspond to either of the amplifier packages of FIGS. 1 and 2, arranged on a printed circuit board (PCB), according to an embodiment.

FIG. 3 shows an illustrative top-down view of an example amplifier system 300 (e.g., an example embodiment of the amplifier system 100 of FIG. 1), arranged on a substrate 301, which may be a printed circuit board (PCB) substrate. Various aspects of the amplifier system 300 may be similar to those of the amplifier system 100 of FIG. 1, and, accordingly, like reference numerals are used to refer to like elements. Descriptions of such elements that have already been provided above are not necessarily repeated here for sake of brevity.

The amplifier system 300 may include the substrate 301, the amplifier package 101, the coupler 118, the coupler 148, the input 102 ("RF IN"), the output 150 ("RF OUT"), coupling capacitors 312, 314, 316, 318, 320, 322, resistors 306, 310, drain bias voltage nodes 304, and gate bias voltage nodes 302. It should be understood that connections between various components on the substrate 301 of the amplifier system 300 may be implemented via conductive traces (e.g., conductive PCB traces) formed on the substrate 301, as shown. It should be understood that, although not shown in the present example, impedance matching circuitry (e.g., any or all of the impedance matching circuitries 104, 108, 112, 116, 120, 124, 128, 132, 134, 138, 142, 146 of FIG. 1) may be included in the amplifier system 300 and coupled to inputs and outputs of each of the pre-driver amplifier 110, the first driver amplifier 126, and the second driver amplifier 140 of the amplifier package 101.

The input 102 may be coupled to an input of the pre-driver amplifier 110 via the coupling capacitor 312. The output of the pre-driver amplifier 110 may be coupled to the input (first port) of the coupler 118 via the coupling capacitor 314. The first output (second port) of the coupler 118 may be coupled to the input of the first driver amplifier 126 via the coupling capacitor 318. The second output (third port) of the coupler 118 may be coupled to the input of the second driver amplifier 140 via the coupling capacitor 316. The output of the first driver amplifier 126 may be coupled to the first input (first port) of the coupler 148 via the coupling capacitor 322. The output of the second driver amplifier 140 may be coupled to the second input (second port) of the coupler 148 via the coupling capacitor 320. The output (third port) of the coupler 148 may be coupled to the output 150. The coupler 118 may have a fourth port coupled to a ground 307 via the resistor 306. The coupler 148 may have a fourth port coupled to the ground 307 via the resistor 310.

Each of the gate bias voltage nodes 302 may be coupled to a gate bias voltage supply from which each of the gate bias voltage nodes 302 receive a gate bias voltage, Vgs. In one or more embodiments, (e.g., when each of the amplifiers 110, 126, 140 are in respective class AB configurations— such as in one or more embodiments of the amplifier systems 400, 600 of FIGS. 4 and 6) the gate bias voltage at each of the gate bias voltage nodes 302-1, 302-2, 302-3 may be around −2.5 V for embodiments in which the amplifiers 110, 126, 140 are GaN-based amplifiers or around 2.5 V for embodiments in which the amplifiers 110, 126, 140 are LDMOS amplifiers. In one or more other embodiments (e.g., when the amplifiers 110, 126 are in respective class AB configurations and the amplifier 140 is in a class C configuration—such as in one or more embodiments of the amplifier system 500 of FIG. 5), the gate bias voltage at the gate bias voltage nodes 302-2, 302-3 may be around −2.5 V for embodiments in which the amplifiers 110, 126 are GaN-based amplifiers or around 2.5V for embodiments in which the amplifiers 110, 126 are LDMOS amplifiers and the gate bias voltage at the gate bias voltage node 302-1 may be around −4 V to around −6 V for embodiments in which the amplifier 140 is a GaN-based amplifier or around 0.3V to around 1V for embodiments in which the amplifier 140 is a LDMOS amplifier. A first gate bias voltage node 302-1 may be coupled to the input of the second driver amplifier 140 and may be configured to provide the gate bias voltage from the gate bias voltage supply to the input of the second driver amplifier 140. A second gate bias voltage node 302-2 may be coupled to the input of the first driver amplifier 126 and may be configured to provide the gate bias voltage from the gate bias voltage supply to the input of the first driver amplifier 126. A third gate bias voltage node 302-3 may be coupled to the input of the pre-driver amplifier 110 and may be configured to provide the gate bias voltage from the gate bias voltage supply to the input of the pre-driver amplifier 110.

Each of the drain bias voltage nodes 304 may be coupled to a drain bias voltage supply from which each of the gate bias voltage nodes 302 receive a drain bias voltage. For example, the drain bias voltage may be between around 40 V to around 50 V (e.g., around 48 V for GaN-based amplifiers) or between around 20 V to around 30 V (e.g., around 28 V for LDMOS amplifiers). A first drain bias voltage node 304-1 may be coupled to the output of the second driver amplifier 140 and may be configured to provide the drain bias voltage from the drain bias voltage supply to the output of the second driver amplifier 140. A second drain bias voltage node 304-2 may be coupled to the output of the first driver amplifier 126 and may be configured to provide the drain bias voltage from the drain bias voltage supply to the output of the first driver amplifier 126. A third drain bias voltage node 304-3 may be coupled to the output of the pre-driver amplifier 110 and may be configured to provide the drain bias voltage from the drain bias voltage supply to the output of the pre-driver amplifier 110.

While in the present example, the amplifier system 300 includes the amplifier package 101 of FIG. 1, this is intended to be illustrative and not limiting. For example, in one or more other embodiments, the amplifier package 201 of FIG. 2 may be included in the amplifier system 300 in place of the amplifier package 101.

Figure 4:
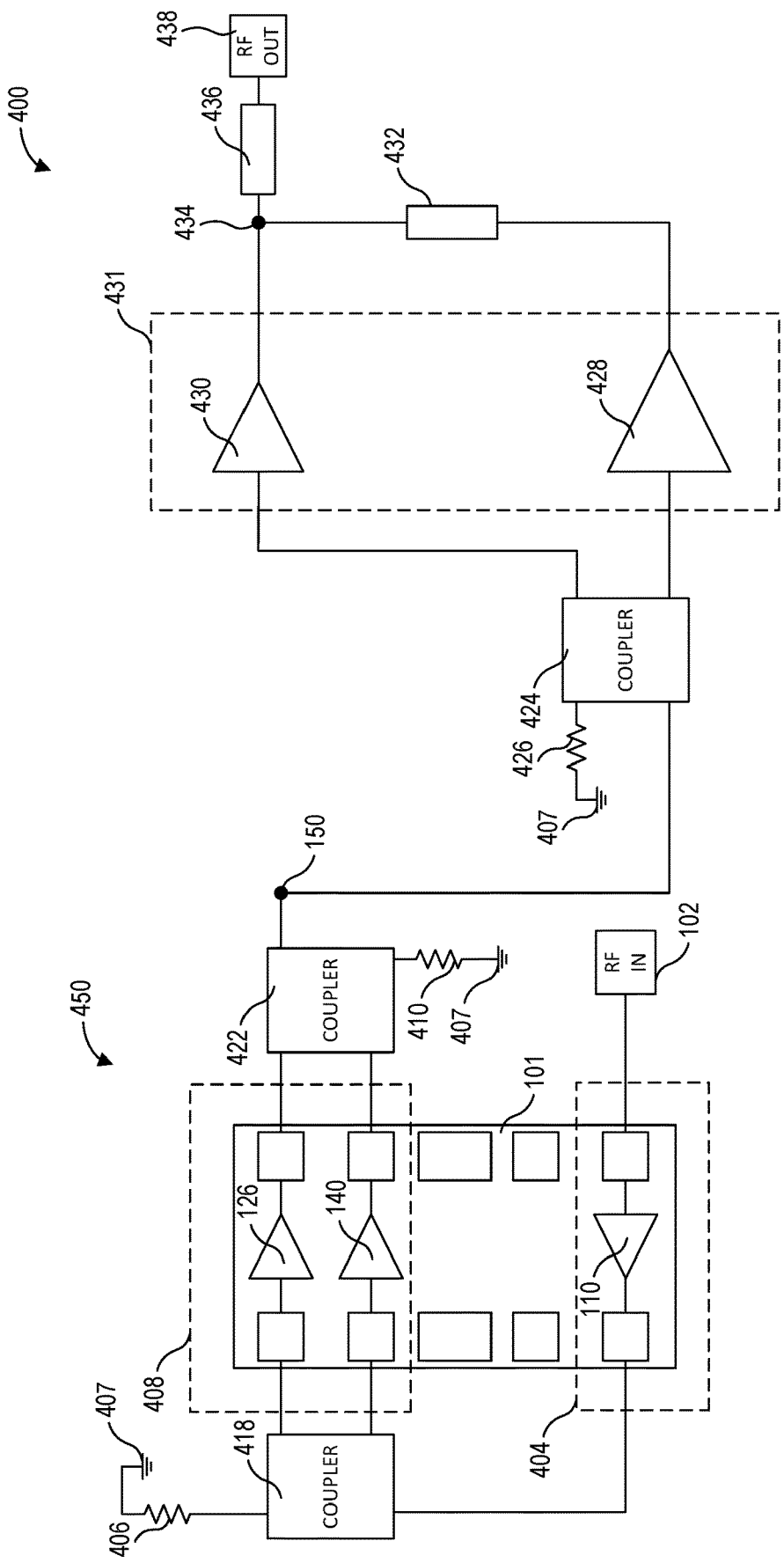
FIG. 4 shows a block diagram of an example three-stage amplifier that includes a two-stage amplifier package, which may correspond to either of the amplifier packages of FIGS. 1 and 2, with a second stage that may be in a class AB configuration, coupled to a final amplification stage, according to an embodiment.

FIG. 4 shows an example three-stage amplifier system 400 that includes a two-stage amplifier system 450 (e.g., an example embodiment of the amplifier system 100 of FIG. 1) in which a first amplification stage and a second amplification stage are each included in a single amplifier package 101. In the present example, the second amplification stage (including the first driver amplifier 126 and the second driver amplifier 140) may be arranged in a class AB amplifier configuration. Various aspects of the amplifier system 400 may be similar to those of the amplifier system 100 of FIG. 1, and, accordingly, like reference numerals are used to refer to like elements. Descriptions of such elements that have already been provided above are not necessarily repeated here for sake of brevity.

The amplifier system 400 may include a first amplification stage 404 that includes the pre-driver amplifier 110 of the amplifier package 101, a second amplification stage 408 that includes the first driver amplifier 126 and the second driver amplifier 140 of the amplifier package 101, and a third (i.e., final) amplification stage 431 that includes a carrier amplifier 430 and a peaking amplifier 428. It should be understood that, although not shown in the present example, impedance matching circuitry (e.g., any or all of the impedance matching circuitries 104, 108, 112, 116, 120, 124, 128, 132, 134, 138, 142, 146 of FIG. 1) may be included in the amplifier system 400 and coupled to inputs and outputs of each of the pre-driver amplifier 110, the first driver amplifier 126, and the second driver amplifier 140 of the amplifier package 101 and to inputs and outputs of the carrier amplifier 430 and the peaking amplifier 428 of the third amplification stage 431.

The input 102 may be coupled to an input of the pre-driver amplifier 110 of the first amplification stage 404. The input 102 may pass RF signals received from an RF signal source to the pre-driver amplifier 110 for amplification. The pre-driver amplifier 110 may amplify the RF signals to generate amplified RF signals. The output of the pre-driver amplifier 110 may be coupled to an input (i.e., "first port") of a coupler 418 (e.g., the coupler 118 of FIG. 1), such that amplified RF signals generated by the pre-driver amplifier 110 are provided to the input of the coupler 418. The coupler 418 may divide the RF signals received from the pre-driver amplifier 110 into first RF signals having a first RF signal power and output via a first output (i.e., "second port") of the coupler 418 and second RF signals having a second RF signal power and output via a second output (i.e., "third port") of the coupler 418, such that a first RF signals are routed along a first amplification path that includes the first driver amplifier 126 and a second RF signals are routed along a second amplification path that includes the second driver amplifier 140. The first RF signal power may correspond to a first percentage of the original RF signal power of the corresponding RF signals received at the input of the coupler 418, and the second RF signal power may correspond to the second percentage of the original RF signal power of the corresponding RF signals received at the input of the coupler 418. In one or more embodiments, the coupler 418 is a symmetrical coupler configured to divide received RF signals such that the first RF signal power equals the second RF signal power. In one or more other embodiments, the coupler 418 is an asymmetrical coupler configured to divide the received RF signals such that the first RF signal power is different from the second RF signal power. The coupler 418 may include a fourth port coupled to a ground 407 via a resistor 406.

The first driver amplifier 126 may amplify the first RF signal power of the first RF signals received from the first output of the coupler 418 to generate first amplified RF signals, which the first driver amplifier 126 may output to a first input (i.e., "first port") of a coupler 422 (e.g., the coupler 148 of FIG. 1). The second driver amplifier 140 may amplify the second RF signal power of the second RF signals received from the second output of the coupler 418 to generate second amplified RF signals, which the first driver amplifier 126 may output to a second input (i.e., "second port") of the coupler 422. The coupler 422 may combine the first amplified RF signals and the second amplified RF signals to generate first combined RF signals, which the coupler 422 may provide to the output 150 via an output (i.e., "third port") of the coupler 422. The coupler 422 may include a fourth port that is coupled to the ground 407 via a resistor 410.

The output of the coupler 422 may be coupled to an input (i.e., "first port") of a coupler 424 via the output 150, such that the first combined RF signals output by the coupler 422 are received by the coupler 424 at its input. The coupler 424 may be a 3 dB coupler, as a non-limiting example. The coupler 424 may divide the first combined RF signals into carrier signals that the coupler 424 provides to the carrier amplifier 430 via a first output (i.e., "second port") of the coupler 424 and peaking signals that the coupler 424 provides to the peaking amplifier 428 via a second output (i.e., "third port") of the coupler 424. The coupler 424 may include a fourth port that is coupled to the ground 407 via a resistor 426. The coupler 424 may divide the first combined RF signals such that the RF signal power of the carrier signals is different from (e.g., greater than) the RF signal power of the peaking signals. In one or more embodiments, the coupler 424 may be a symmetrical 3 dB coupler. The carrier amplifier 430 may be coupled along a carrier amplification path that extends from the first output of the coupler 424 to the combining node 434. The peaking amplifier 428 may be coupled along a peaking amplification path that extends from the second output of the coupler 424 to the combining node 434.

The carrier amplifier 430 may be configured to amplify the carrier signals to generate amplified carrier signals, which the carrier amplifier 430 may output to a combining node 434. The peaking amplifier 428 may be configured to amplify the peaking signals to generate amplified peaking signals, which the peaking amplifier may output to the combining node 434 via an offset line 432 (e.g., a phase offset line), which may be configured to reduce phase differences between peaking signals and carrier signals (i.e., by changing the phase of the peaking signal), such that these signals may be suitably combined at the combining node 434. For example, the amplified carrier signals and the amplified peaking signals may be combined at the combining node 434 to produce second combined RF signals. The second combined RF signals may then be provided to an output 438 via an impedance transformer 436 (e.g., a quarter-wave impedance transformer). The carrier amplifier 430 and the peaking amplifier 428 of the third amplification stage 431 may be configured, in conjunction with the combining node 434, the offset line 432, and the impedance transformer 436, as an asymmetrical Doherty amplifier. The output 438 may be coupled to a resistive load (e.g., an antenna, for one or more embodiments in which the amplifier system 400 may be included in an RF transmitter device).

In the present example, the couplers 422 and 424 advantageously provide inter-stage isolation between the second amplification stage 408 and the third amplification stage 431, such that additional inter-stage isolator (e.g., a circulator) is not required. By providing the second amplification stage 408 in a class AB configuration, the second amplification stage 408 may have advantageously little or no contribution to the degradation of linearity of the third amplification stage 431, with the possible drawback of reduced end-to-end line-up efficiency of the amplifier system 400.

While in the present example, the amplifier system 400 includes the amplifier package 101 of FIG. 1, this is intended to be illustrative and not limiting. For example, in one or more other embodiments, the amplifier package 201 of FIG. 2 may be included in the amplifier system 400 in place of the amplifier package 101.

FIG. 5 shows an example three-stage amplifier system 500 that includes a two-stage amplifier system 550 (e.g., an example embodiment of the amplifier system 100 of FIG. 1) in which a first amplification stage and a second amplification stage are each included in a single amplifier package 101. In the present example, the second amplification stage (including the first driver amplifier 126 and the second driver amplifier 140) may be arranged in a Doherty amplifier configuration. Various aspects of the amplifier system 500 may be similar to those of the amplifier system 100 of FIG. 1 and the amplifier system 400 of FIG. 4, and, accordingly, like reference numerals are used to refer to like elements. Descriptions of such elements that have already been provided above are not necessarily repeated here for sake of brevity.

In the present example, the second amplification stage 408 may be configured as a Doherty amplifier (e.g., an asymmetrical Doherty amplifier), such that the first RF signals amplified by the first driver amplifier 126 (acting as a carrier amplifier in this case) are output to a combining node 502 and the second RF signals amplified by the second driver amplifier 140 (acting as a peaking amplifier in this case) are output to the combining node 502 via an offset line 506 (e.g., a phase offset line), which may be configured to reduce phase differences between first (peaking) RF signals and second (carrier) RF signals (i.e., by changing the phase of the peaking signal), such that these signals may be suitably combined at the combining node 502. For example, the amplified first RF signals and the amplified second RF signals may be combined at the combining node 502 to generate the first combined RF signals. The first combined RF signals may be passed to the output 150 via an impedance transformer 504 (e.g., a quarter-wave impedance transformer).

Because the combining node 502 does not provide inter-stage isolation in the same way that, say, the coupler 422 of FIG. 4 does, an RF circulator 507 is coupled between the output 150 and the input of the coupler 424. For example, the RF circulator 507 may include a first port that is coupled to the output 150, a second port that is coupled to the input of the coupler 424, and a third port that is coupled to the ground 407 via a resistor 510. The RF circulator 507 may only allow one-way signal traffic between its ports (e.g., from the first port to the second port and from the second port to the third port, but not from the second port to the first port), thereby providing inter-stage isolation between the second amplification stage 408 and the third amplification stage 431.

By providing the second amplification stage 408 in a Doherty configuration in the present example, the second amplification stage 408 may provide improved line-up efficiency (e.g., compared to that of a class AB configuration) for the amplifier system 500, with the possible drawback of reduced raw linearity and linearizability of the amplifier system 500.

While in the present example, the amplifier system 500 includes the amplifier package 101 of FIG. 1, this is intended to be illustrative and not limiting. For example, in one or more other embodiments, the amplifier package 201 of FIG. 2 may be included in the amplifier system 500 in place of the amplifier package 101.

Figure 6:
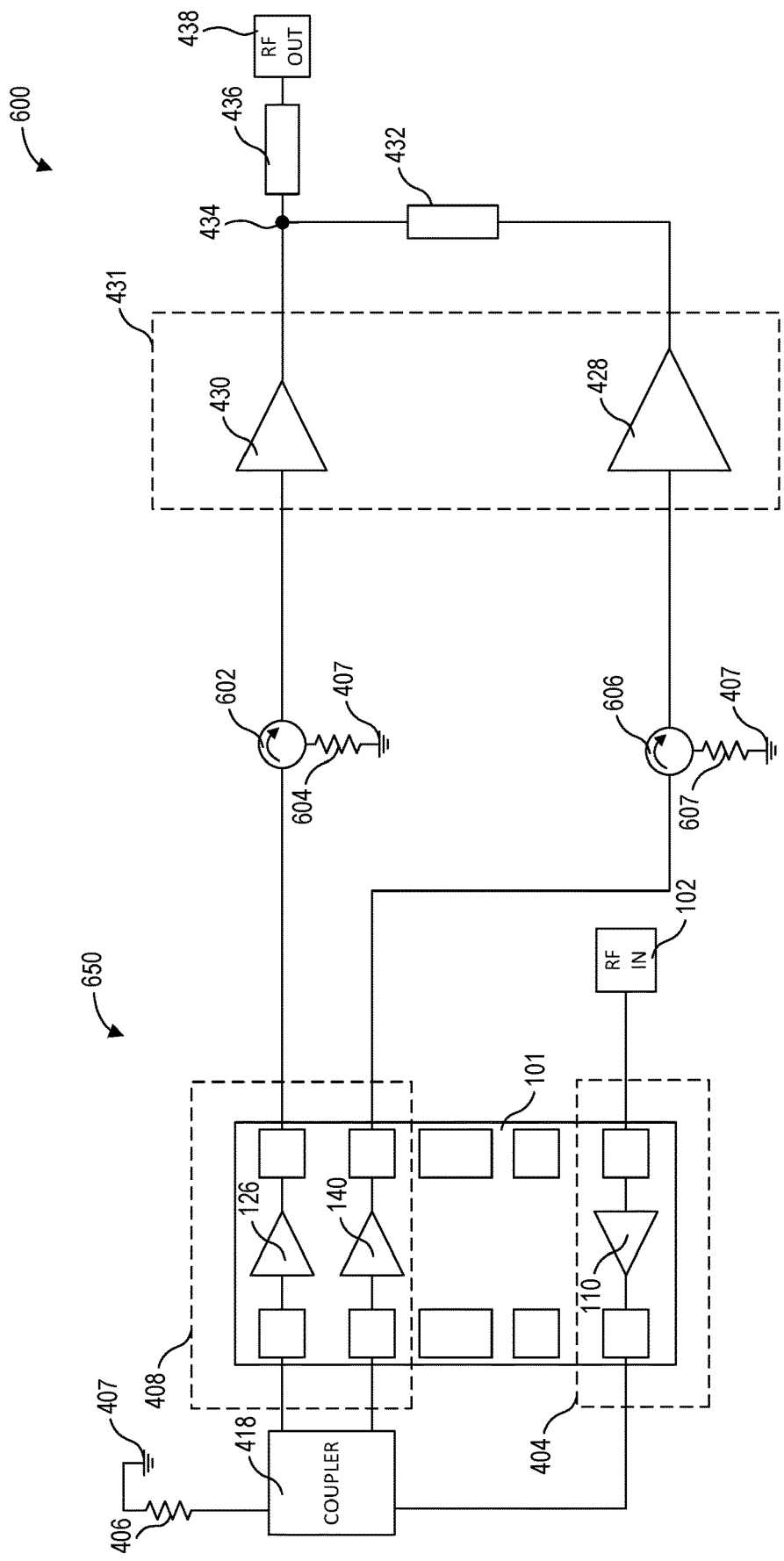
FIG. 6 shows a block diagram of an example three-stage amplifier that includes a two-stage amplifier package, which may correspond to either of the amplifier packages of FIGS. 1 and 2, with a second stage that may be in a multi-stage Doherty configuration in conjunction with a final amplification stage, according to an embodiment.

FIG. 6 shows an example three-stage amplifier system 600 that includes a two-stage amplifier system 650 (e.g., an example embodiment of the amplifier system 100 of FIG. 1) in which a first amplification stage and a second amplification stage are each included in a single amplifier package 101. In the present example, the second amplification stage (including the first driver amplifier 126 and the second driver amplifier 140) may be arranged in a multi-stage Doherty amplifier configuration. Various aspects of the amplifier system 600 may be similar to those of the amplifier system 100 of FIG. 1 and the amplifier system 400 of FIG. 4, and, accordingly, like reference numerals are used to refer to like elements. Descriptions of such elements that have already been provided above are not necessarily repeated here for sake of brevity.

In the present example, the second amplification stage 408 and the third amplification stage 431 may be collectively configured as a multi-stage Doherty amplifier (e.g., with two asymmetrical Doherty amplification stages), such that the first RF signals amplified by the first driver amplifier 126 (acting as a carrier amplifier in this case) are output to an input of the carrier amplifier 430 and the second RF signals amplified by the second driver amplifier 140 (acting as a peaking amplifier in this case) are output to an input of the peaking amplifier 428. The amplified first RF signals and the amplified second RF signals may act as the carrier signals and peaking signals for the third amplification stage 431 and are not re-combined prior to being provided to the third amplification stage 431.

To provide inter-stage isolation between the second amplification stage 408 and the third amplification stage 431 a first RF circulator 602 is coupled between the output of the first driver amplifier 126 and the input of the and the input of the carrier amplifier 430 and a second RF circulator 606 is coupled between the output of the second driver amplifier 140 and the input of the peaking amplifier 428. For example, the RF circulator 602 may include a first port that is coupled to the output of the first driver amplifier 126, a second port that is coupled to the input of the carrier amplifier 430, and a third port that is coupled to the ground 407 via a resistor 604. For example, the RF circulator 606 may include a first port that is coupled to the output of the second driver amplifier 140, a second port that is coupled to the input of the peaking amplifier 428, and a third port that is coupled to the ground 407 via a resistor 607. As with the RF circulator 507 of FIG. 5, each of the RF circulator 602 and the RF circulator 606 may only allow one-way signal traffic between ports, thereby providing inter-stage isolation between the second amplification stage 408 and the third amplification stage 431.

By providing the second amplification stage 408 and the third amplification stage 431 collectively in a multi-stage Doherty configuration in the present example, the second amplification stage 408 may provide improved line-up efficiency (e.g., compared to that of a class AB configuration) for the amplifier system 600, with little or no negative impact on raw linearity and linearizability of the amplifier system 600.

While in the present example, the amplifier system 600 includes the amplifier package 101 of FIG. 1, this is intended to be illustrative and not limiting. For example, in one or more other embodiments, the amplifier package 201 of FIG. 2 may be included in the amplifier system 600 in place of the amplifier package 101.

Figure 7:
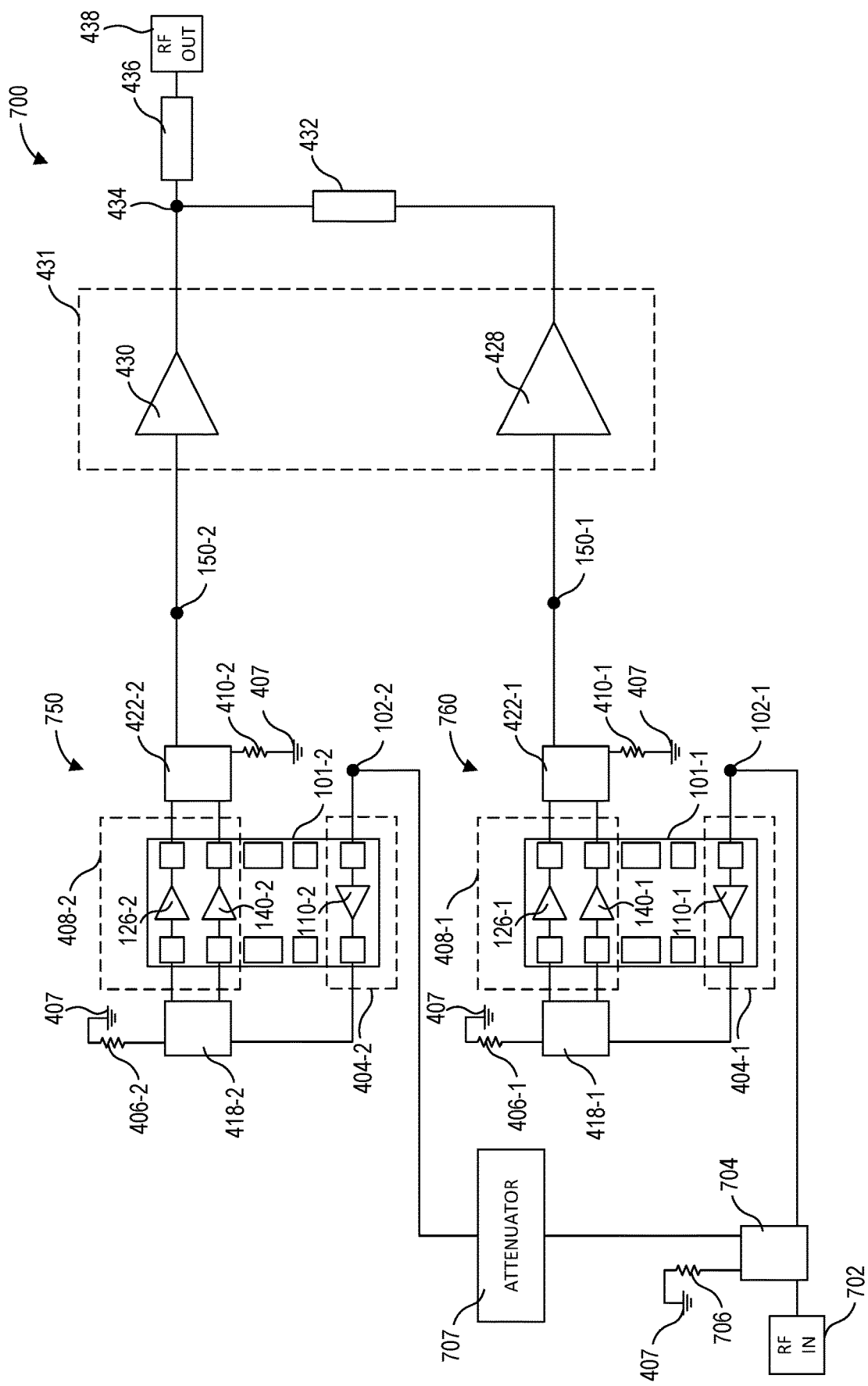
FIG. 7 shows a block diagram of an example three-stage amplifier system that includes two two-stage amplifier packages, which may each correspond to either of the amplifier packages of FIGS. 1 and 2, each coupled to a final amplification stage, according to an embodiment.

FIG. 7 shows an example three-stage amplifier system 700 that includes a two-stage amplifier system 750 (e.g., an example embodiment of the amplifier system 100 of FIG. 1) in which a first amplification stage and a second amplification stage are each included in a single amplifier package 101. In the present example, the second amplification stage (including the first driver amplifier 126 and the second driver amplifier 140) may be arranged in a dual-driver, multi-stage Doherty amplifier configuration. That is, the amplifier system 700 may include two separate drivers, the two-stage amplifier system 750 and the two-stage amplifier system 760, that respectively provide the carrier signals and peaking signals for amplification at the third amplification stage 431. Various aspects of the amplifier system 700 may be similar to those of the amplifier system 100 of FIG. 1 and the amplifier system 400 of FIG. 4, and, accordingly, like reference numerals are used to refer to like elements. Descriptions of such elements that have already been provided above are not necessarily repeated here for sake of brevity.

The amplifier system 700 may include an input 702 configured to receive RF signals from an RF signal source (not shown). The input 702 may be coupled to an input (i.e., "first port") of a coupler 704, which may be a 3 dB coupler (e.g., a symmetrical 3 dB coupler, as a non-limiting example). The coupler 704 may divide the RF signals received from the input 702 into first input RF signals having first RF signal power and second input RF signals having second RF signal power. In one or more embodiments, the coupler 704 may be a symmetrical coupler and the first and second RF signal powers may be equal. In one or more other embodiments, the coupler 704 may be an asymmetrical coupler and the first RF signal power may be different from (e.g., greater than) the second RF signal power. The coupler 704 may provide the first input RF signals to a first input 102-2 of the two-stage amplifier system 750 via a first output (i.e., "second port") of the coupler 704. The coupler 704 may provide the second input RF signals to a second input 102-1 of the two-stage amplifier system 760 via a second output (i.e., "third port") of the coupler 704. An attenuator 707 may be coupled between the first output of the coupler 704 and the first input 102-2 of the two-stage amplifier system 750 and may be configured to attenuate the first RF input signals. In one or more embodiments, each of the two-stage amplifier systems 750, 760 may correspond to respective embodiments of the two-stage amplifier system 450 of FIG. 4, details of which are not repeated here for sake of brevity.

The two-stage amplifier system 750 may amplify the attenuated first RF input signals to generate carrier signals at a first output 150-2, which are provided to the input of the carrier amplifier 430 of the third amplification stage 431. The two-stage amplifier system 760 may amplify the second RF input signals to generate peaking signals at the second output 150-1, which are provided to the input of the peaking amplifier 428 of the third amplification stage 431. For example, the two-stage amplifier system 750 may act as a first stage of amplification and a second stage of amplification for a carrier path of a multi-stage Doherty amplifier configuration, the carrier amplifier 430 may act as a third stage of amplification for the carrier path, the two-stage amplifier system 760 may act as a first stage of amplification and a second stage of amplification for a peaking path of the multi-stage Doherty amplifier configuration, and the peaking amplifier 428 may act as a third stage of amplification for the peaking path.

Because the two-stage amplifier systems 750, 760 include couplers 422-1, 422-2 at the outputs 150-1, 150-2, there is not a need to provide additional inter-stage isolation (e.g., via RF circulators), which may reduce the cost of the amplifier system 700. By providing collectively providing the two-stage amplifier systems 750, 760, and the third amplification stage 431 in a dual-driver, multi-stage Doherty configuration in the present example, the second amplification stage 408 may provide improved line-up efficiency (e.g., compared to that of a class AB configuration) for the amplifier system 700, with little or no negative impact on raw linearity and linearizability of the amplifier system 700.

While in the present example, the amplifier system 700 includes the amplifier package 101 of FIG. 1, this is intended to be illustrative and not limiting. For example, in one or more other embodiments, the amplifier package 201 of FIG. 2 may be included in the amplifier system 700 in place of the amplifier package 101.

Figure 8:
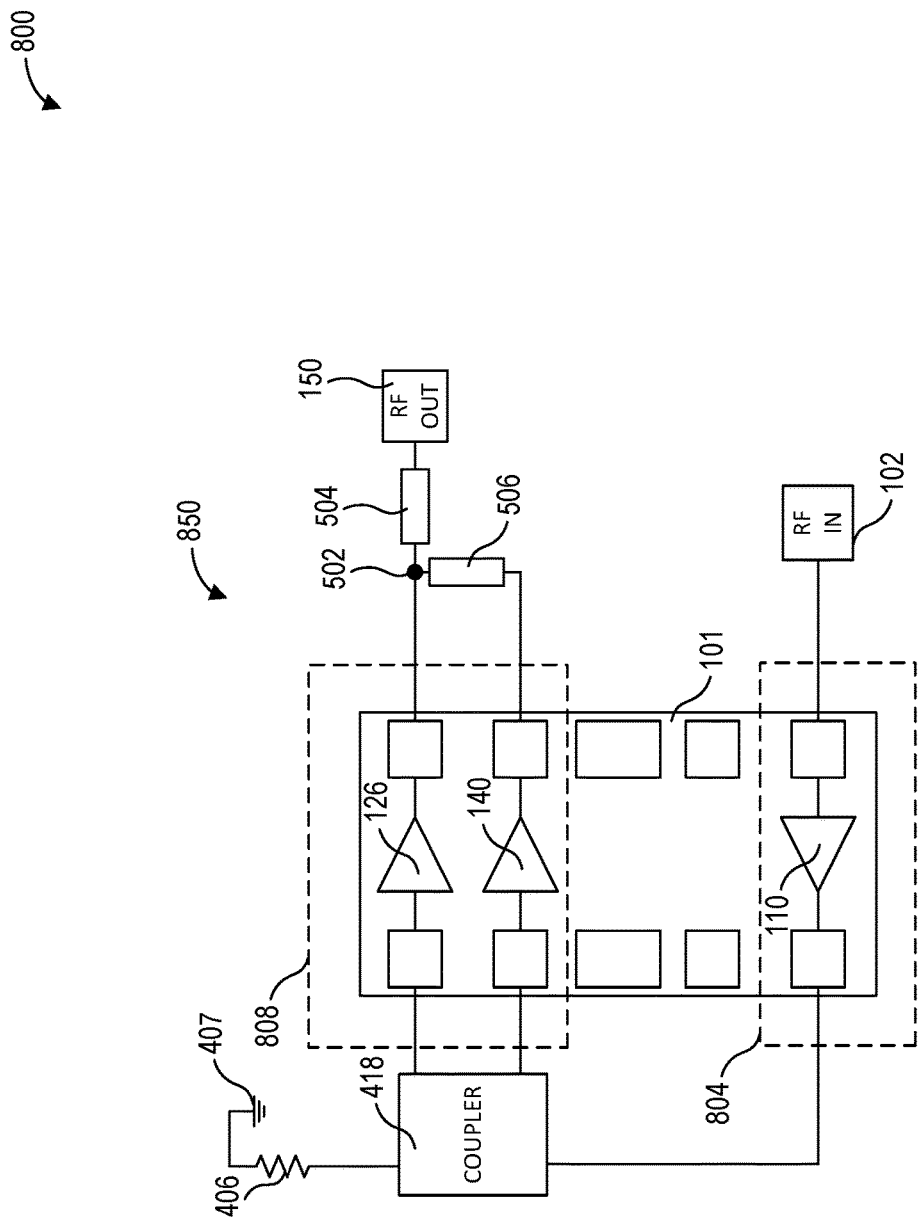
FIG. 8 shows a block diagram of an example amplifier system that includes a two-stage amplifier package, which may correspond to either of the amplifier packages of FIGS. 1 and 2, and which provides the second and third (final) amplification stages of the amplifier system, according to an embodiment.

FIG. 8 shows an example amplifier system 800 that includes a two-stage amplifier system 850 (e.g., an example embodiment of the amplifier system 100 of FIG. 1) in which a second amplification stage and a third amplification stage are each included in a single amplifier package 101. Various aspects of the amplifier system 800 may be similar to those of the amplifier system 100 of FIG. 1, the amplifier system 400 of FIG. 4, and the amplifier system 500 of FIG. 5 and, accordingly, like reference numerals are used to refer to like elements. Descriptions of such elements that have already been provided above are not necessarily repeated here for sake of brevity.

In the present example, the amplifiers 126, 140 correspond to the third (i.e., final) amplification stage 808 and may be arranged in a Doherty amplifier configuration (e.g., corresponding to an asymmetrical Doherty amplifier), such that the first RF signals amplified by the first driver amplifier 126 (acting as a carrier amplifier in this case) are output to a combining node 502 and the second RF signals amplified by the second driver amplifier 140 (acting as a peaking amplifier in this case) are output to the combining node 502 via an offset line 506 (e.g., a phase offset line), which may be configured to reduce phase differences between first (peaking) RF signals and second (carrier) RF signals (i.e., by changing the phase of the peaking signal), such that these signals may be suitably combined at the combining node 502. For example, the amplified first RF signals and the amplified second RF signals may be combined at the combining node 502 to generate the first combined RF signals. The first combined RF signals may be passed to the output 150 via an impedance transformer 504 (e.g., a quarter-wave impedance transformer).

The amplifier 110 corresponds to a second amplification stage 804 and may be coupled to inputs of the amplifiers 126, 140 via the coupler 418. A first amplification stage (not shown) may be coupled to the input (e.g., gate) of the amplifier 110 via the input 102.

In one or more embodiments, the two-stage amplifier 850 may provide the final stage of amplification (i.e., the final stage of amplification here corresponding to the third amplification stage 808) in a massive multiple-input multiple-output (MIMO) wireless communication system, which may advantageously reduce the transmit path power requirement for the massive MIMO wireless communication system when compared to, for example, an arrangement in which such a two-stage amplifier system instead acts as the driver for a separate final stage (e.g., such as the arrangement of the amplifier system 500 of FIG. 5).

In one or more embodiments, including some embodiments in which the amplifier system 800 is included in a massive MIMO wireless communication system and the third amplification stage 808 provides a final stage of amplification for such a system, the Doherty amplifier arrangement of the amplifiers 126, 140 may be asymmetric (e.g., with output power of the amplifier 140 being greater than that of the amplifier 126, resulting in an uneven power drive), which may improve back-off efficiency. In one or more such embodiments, the coupler 418 may be an asymmetric coupler (e.g., a 5 dB coupler).

While in the present example, the amplifier system 800 includes the amplifier package 101 of FIG. 1, this is intended to be illustrative and not limiting. For example, in one or more other embodiments, the amplifier package 201 of FIG. 2 may be included in the amplifier system 800 in place of the amplifier package 101.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter. Furthermore, the term "amplifier" used herein should be understood to refer to a "power amplifier" unless noted otherwise.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier package comprising:
   a first amplification stage comprising:
      a first amplifier aligned in a first direction;
   a second amplification stage comprising:
      a second amplifier aligned in a second direction, the second amplifier disposed in a first amplification path; and
      a third amplifier aligned in the second direction, the third amplifier disposed in a second amplification path that is separate from the first amplification path, wherein the second direction is opposite the first direction;
   a reference plane on which each of the first amplifier, the second amplifier, and the third amplifier are disposed;
   a first wire fence disposed on the reference plane between the first amplification path and the second amplification path; and
   a second wire fence disposed on the reference plane between the first amplification stage and the second amplification stage.

2. The amplifier package of claim 1, wherein an input of the first amplifier is coupled to a first conductive pad at a first side of the amplifier package, an output of the first amplifier is coupled to a second conductive pad at a second side of the amplifier package, an input of the second amplifier is coupled to a third conductive pad at the second side of the amplifier package, and an output of the second amplifier is coupled to a fourth conductive pad at the first side of the amplifier package.

3. The amplifier package of claim 1, wherein each of the first amplifier, the second amplifier, and the third amplifier respectively include at least one gallium nitride transistor device.

4. An amplifier system comprising:
   a first amplifier package comprising:
      a first amplification stage comprising:
         a pre-driver amplifier aligned in a first direction; and
      a second amplification stage comprising:
         a first driver amplifier aligned in a second direction, the first driver amplifier disposed in a first amplification path; and
         a second driver amplifier aligned in the second direction, the second driver amplifier disposed in a second amplification path that is separate from the first amplification path, wherein the second direction is opposite the first direction; and a first coupler comprising:
      a first port coupled to an output of the pre-driver amplifier;
      a second port coupled to an input of the first driver amplifier; and
      a third port coupled to an input of the second driver amplifier.

5. The amplifier system of claim 4, the first amplifier package further comprising:
   a reference plane on which each of the pre-driver amplifier, the first driver amplifier, and the second driver amplifier are disposed.

6. The amplifier system of claim 5, the first amplifier package further comprising:
   a first wire fence disposed on the reference plane between the first amplification path and the second amplification path; and
   a second wire fence disposed on the reference plane between the first amplification stage and the second amplification stage.

7. The amplifier system of claim 4, comprising:
   a third amplification stage coupled to the second amplification stage, the third amplification stage comprising:
      a carrier amplifier; and
      a peaking amplifier; and
   a first combining node coupled to an output of the carrier amplifier and an output of the peaking amplifier.

8. The amplifier system of claim 7, further comprising:
   a second coupler having inputs respectively coupled to an output of the first driver amplifier and an output of the second driver amplifier; and
   a third coupler having an input coupled to an output of the second coupler and having outputs respectively coupled to an input of the carrier amplifier and an input of the peaking amplifier.

9. The amplifier system of claim 7, further comprising:
   a second combining node coupled to an output of the first driver amplifier and an output of the second driver amplifier;
   a second coupler having outputs respectively coupled to an input of the carrier amplifier and an input of the peaking amplifier; and
   a circulator coupled between the second combining node and an input of the second coupler.

10. The amplifier system of claim 7, further comprising:
    a first circulator coupled between an output of the first driver amplifier and an input of the carrier amplifier; and
    a second circulator coupled between an output of the second driver amplifier and an input of the peaking amplifier.

11. The amplifier system of claim 7, further comprising:
    a second amplifier package comprising:
       a fourth amplification stage comprising:
          a second pre-driver amplifier aligned in the first direction; and
       a fifth amplification stage comprising:
          a third driver amplifier aligned in the second direction, the third driver amplifier disposed in a third amplification path; and
          a fourth driver amplifier aligned in the second direction, the fourth driver amplifier disposed in a fourth amplification path that is separate from the third amplification path; and a second coupler comprising:
- a fourth port coupled to an output of the second pre-driver amplifier;
- a fifth port coupled to an input of the third driver amplifier; and
- a sixth port coupled to an input of the fourth driver amplifier.

12. The amplifier system of claim 11, further comprising:
- a third coupler having inputs respectively coupled to an output of the first driver amplifier and an output of the second driver amplifier and having an output coupled to an input of the carrier amplifier; and
- a fourth coupler having inputs respectively coupled to an output of the third driver amplifier and an output of the fourth driver amplifier and having an output coupled to an input of the peaking amplifier; and
- a fifth coupler having an input coupled to an input of the amplifier system and having outputs respectively coupled to an input of the pre-driver amplifier and an input of the second pre-driver amplifier.

13. The amplifier system of claim 12, further comprising:
- an attenuator coupled between the fifth coupler and the input of the pre-driver amplifier.

14. The amplifier system of claim 4, wherein the first driver amplifier and the second driver amplifier are in a class AB amplifier configuration.

15. The amplifier system of claim 4, wherein the first driver amplifier and the second driver amplifier are in a Doherty amplifier configuration.

16. The amplifier system of claim 4, wherein each of the pre-driver amplifier, the first driver amplifier, and the second driver amplifier respectively include gallium nitride transistor devices.

17. The amplifier system of claim 4, wherein an input of the pre-driver amplifier is coupled to a first conductive pad at a first side of the first amplifier package, an output of the pre-driver amplifier is coupled to a second conductive pad at a second side of the first amplifier package, an input of the first driver amplifier is coupled to a third conductive pad at the second side of the first amplifier package, and an output of the first driver amplifier is coupled to a fourth conductive pad at the first side of the first amplifier package, wherein the first side is opposite the second side.

18. The amplifier system of claim 4, wherein an input of the pre-driver amplifier is coupled to a first conductive pad at a first side of the first amplifier package, an output of the pre-driver amplifier is coupled to a second conductive pad at a second side of the first amplifier package, an input of the first driver amplifier is coupled to a third conductive pad at the second side of the first amplifier package, and an output of the first driver amplifier is coupled to a fourth conductive pad at a third side of the first amplifier package, wherein the third side is opposite the second side.

* * * * *